(12) United States Patent
Liu et al.

(10) Patent No.: US 11,508,872 B2
(45) Date of Patent: Nov. 22, 2022

(54) ALIGNMENT MODULE FOR TRANSFERRING A MAGNETIC LIGHT-EMITTING DIE AND ALIGNMENT METHOD THEREOF

(71) Applicant: INGENTEC CORPORATION, Miaoli County (TW)

(72) Inventors: Ai Sen Liu, Miaoli County (TW); Hsiang An Feng, Miaoli County (TW); Chia Wei Tu, Miaoli County (TW); Ya Li Chen, Miaoli County (TW)

(73) Assignee: Ingentec Corporation, Zhunan (TW)

( * ) Notice: Subject to any disclaimer, the term of this patent is extended or adjusted under 35 U.S.C. 154(b) by 140 days.

(21) Appl. No.: 17/198,388

(22) Filed: Mar. 11, 2021

(65) Prior Publication Data

US 2022/0190196 A1 Jun. 16, 2022

(30) Foreign Application Priority Data

Dec. 14, 2020 (TW) .................................. 109144076

(51) Int. Cl.
*H01L 33/00* (2010.01)
(52) U.S. Cl.
CPC ................................ *H01L 33/0095* (2013.01)

(58) Field of Classification Search
None
See application file for complete search history.

(56) References Cited

U.S. PATENT DOCUMENTS

| 11,264,257 | B2 * | 3/2022 | Yang | ................. H01L 21/67709 |
| 2019/0304950 | A1 * | 10/2019 | Israel | ................. H01L 33/0095 |
| 2022/0271000 | A1 * | 8/2022 | Zuo | ......................... H01L 24/27 |

* cited by examiner

*Primary Examiner* — Bradley Smith
(74) *Attorney, Agent, or Firm* — Rosenberg, Klein & Lee

(57) ABSTRACT

An alignment module and alignment method for transferring magnetic light-emitting die are provided, including a backplane having at least one cavity, a magnetic pull device and magnetic light-emitting die. The magnetic pull device is located below the cavity and disposed correspondingly to the cavity. The magnetic light-emitting die includes a magnetic metallic substrate and a peripheral electrode formed on the magnetic metallic substrate. The peripheral electrode is surrounding on the magnetic metallic substrate and formed adjacent to an inner edge of the magnetic metallic substrate. Depth of the cavity is designed as equal to a thickness of the magnetic metallic substrate such that the die is accommodated and aligning transferred to the backplane by using the cavity and magnetic pull device. By employing the proposed die alignment techniques, accurate alignment result is achieved and thereby the present invention is applied perfectly for industrial mass transfer technology.

20 Claims, 16 Drawing Sheets

ALIGNMENT MODULE FOR TRANSFERRING A MAGNETIC LIGHT-EMITTING DIE AND ALIGNMENT METHOD THEREOF

This application claims priority of Application No. 109144076 filed in Taiwan on 14 Dec. 2020 under 35 U.S.C. § 119; the entire contents of all of which are hereby incorporated by reference.

BACKGROUND OF THE INVENTION

Field of the Invention

The present invention relates to a die transferring technology for light emitting diodes. More particularly, it is related to an alignment module and alignment method for transferring a magnetic light-emitting die having better soft magnetic properties and initial magnetic permeability in a mass transfer process.

Description of the Prior Art

In general, a Light Emitting diode (LED) is a kind of light source which is advantageous of having longer lifetime, higher luminous efficiency, lower failure rate, saving more power, and giving much more stable light. Also, LEDs are highly compatible with various types of lamp devices. Therefore, the luminous life of LEDs is believed to be much longer than that of the traditional light sources, thereby the LEDs have successfully become a mainstream commodity in the market nowadays. Overall, the die structure of LEDs mainly comprises a horizontal structure and a vertical structure. Since the vertical-structure LED has advantages of structural strength, photoelectric parameter, thermal property, luminous decay and fabrication cost, it is believed that it offers much more reliable stability and thus can be widely utilized by the industries.

As the science and technologies improve, these LED dies are gradually being mass transferred onto a variety of electronic devices and their substrates thereof. There are a few conventional techniques, which have been disclosed in the prior arts regarding transferring the die to the substrate, including: SMT (Surface Mount Technology), wafer-to-wafer transfer technology, electrostatic transfer technology, and so on. Among these transfer technologies, each of the dies has to be packaged into a SMD (Surface Mount Device) first in the surface mount technology. And a surface mount machine is employed to use a vacuum nozzle for absorbing and placing these SMD components, one by one onto the circuit board. After that, the SMD components are fixed on the substrate through a reflow furnace. However, the surface mount technology can only transfer a single die at one time. When a mass transfer of the dies is required by the industries, the surface mount technology is not sufficient to use. Considering the wafer-to-wafer transfer technology, the original substrate of the die must be attached to a target substrate, and then the original substrate is peeled off, so as to transfer the die to the target substrate. However, such transferring method demands strict requirements on both sizes of the original substrate and the target substrate. Meanwhile, the spacing of each die to be transferred has to be consistent as well. Owing to these strict requirements and restrictions, the wafer-to-wafer transfer technology application is obviously restricted. As for the electrostatic transfer technology, it is very likely to damage the die structure, and since hardware contact is always generated during the transfer, it is also very easy to damage the substrate. In addition, such transferring technology is limited by the size of its electrostatic electrode as well.

Moreover, when the die structure is transferred onto the target substrate, the die alignment is quite difficult to control and thus can not be accurate even if it was performed by a well-trained human operation or sophisticated transfer technology. And an inaccurate die alignment affects the difficulty and increases the complexity to fix the die in the right position subsequently and may even increase the cost and time for rework.

Therefore, on account of above, to overcome the above-mentioned problems, it should be obvious that there is indeed an urgent need for the professionals in the field for a new alignment module and alignment method for die transfer to be developed that can effectively solve the above mentioned problems occurring in the prior design. By employing the proposed die transfer alignment technology, it achieves to accomplish an optimized result of the alignment design for die transfer. Hereinafter, the detailed specific implementations will be fully described in the following paragraphs.

SUMMARY OF THE INVENTION

In order to overcome the above mentioned disadvantages, one major objective in accordance with the present invention is provided for a an alignment module for transferring a magnetic light-emitting die, which can effectively avoid a plenty of shortcomings occurring in the traditional die transfer technology. By employing the alignment techniques of die transfer disclosed in the present invention, the process time and cost for die transfer can be greatly reduced. Moreover, the proposed alignment techniques are advantageous of being widely used for mass transfer, and successfully meet the requirements for rapid and accurate mass transfer in the industries.

Furthermore, another major objective in accordance with the present invention is provided for an alignment method for transferring a magnetic light-emitting die. By designing a magnetic metallic material with better soft magnetic properties and initial permeability as the die substrate and combining with the corresponding magnetic pull device, the light-emitting die can be successfully magnetically attracted to a cavity in the backplane, thereby accomplish an optimized result of automatic alignment.

And moreover, by employing the alignment module and alignment method for transferring a magnetic light-emitting die of the present invention, when the die is transferred to the backplane and post bonding and wiring process are carried out, an interspace between the electrode and the soldering material can be effectively shortened, reducing the use of the soldering material and its consumables.

For achieving the above mentioned objectives, the alignment module for transferring a magnetic light-emitting die of the present invention comprises a backplane, comprising at least one cavity, at least one magnetic light-emitting die and a magnetic pull device. The magnetic pull device is located below the cavity and disposed correspondingly to the cavity. The magnetic light-emitting die comprises a magnetic metallic substrate and a peripheral electrode formed on the magnetic metallic substrate, wherein the peripheral electrode is surrounding on the magnetic metallic substrate and formed adjacent to an inner edge of the magnetic metallic substrate to provide electrical conduction with at least one pad on the backplane. According to the embodiment of the present invention, a depth of the cavity is equal to a thickness of the magnetic metallic substrate such that the magnetic light-emitting die is aligned, transferred and accommodated in the backplane by using the cavity and the magnetic pull device.

In one embodiment of the present invention, the magnetic pull device is buried in a bottom layer of the backplane corresponding to the cavity.

In another embodiment of the present invention, the magnetic pull device is alternatively disposed external to the backplane.

According to one embodiment of the present invention, the depth of the cavity and the thickness of the magnetic metallic substrate are between 30 µm and 50 µm. The cavity comprises a two-dimensional plane length and a two-dimensional plane width, and the two-dimensional plane length and the two-dimensional plane width of the cavity are equal, which is between 30 µm and 100 µm.

The magnetic metallic substrate also comprises a two-dimensional plane length and a two-dimensional plane width, and the two-dimensional plane length and the two-dimensional plane width of the magnetic metallic substrate are equal. In one embodiment, the two-dimensional plane length and the two-dimensional plane width of the cavity are equal to the two-dimensional plane length and the two-dimensional plane width of the magnetic metallic substrate, such that the magnetic metallic substrate can be just accommodated in the cavity.

In another embodiment, the two-dimensional plane length and the two-dimensional plane width of the cavity, alternatively can be greater than the two-dimensional plane length and the two-dimensional plane width of the magnetic metallic substrate. Under such circumstance, a gap is formed between the magnetic metallic substrate and the cavity after the magnetic light-emitting die is transferred, and the gap can be filled with a soldering material in the subsequent post process. Alternatively, according to yet another embodiment of the present invention, the gap can be filled with an insulating material.

The magnetic light-emitting die disclosed in the present invention further comprises an epitaxial layer and a transparent insulating layer, the epitaxial layer is formed on an upper surface of the magnetic metallic substrate, and the transparent insulating layer covers on the epitaxial layer. The peripheral electrode is disposed on the transparent insulating layer and penetrates through the transparent insulating layer to electrically couple with the epitaxial layer under the transparent insulating layer. And thus, when the magnetic light-emitting die via wiring and packaging forms a vertical type light emitting diode (LED) die of initial magnetic permeability, the magnetic metallic substrate achieves to generate a micro current and transmit the micro current to the epitaxial layer because of the initial magnetic permeability.

On the other hand, the at least one pad on the backplane comprises a first semiconductor type pad and a second semiconductor type pad, which are respectively disposed on opposite sides of the cavity and provide different conductivity types. The first semiconductor type pad and the second semiconductor type pad are electrically connected with the peripheral electrode and the magnetic metallic substrate through a soldering material, respectively. In a preferred embodiment of the present invention, an interspace $\Delta X$ is formed between an outer contact and the peripheral electrode, wherein the outer contact is where the soldering material is connected with the first semiconductor type pad or the second semiconductor type pad. The interspace $\Delta X$, preferably is less than 10 µm.

Furthermore, according to the embodiment of the present invention, the foregoing magnetic metallic substrate at least comprises a nickel-iron alloy layer (Invar). Alternatively, the magnetic metallic substrate may further comprise a copper layer which is disposed on the nickel-iron alloy layer. The nickel-iron alloy layer and the copper layer disclosed by the present invention can be combined through cutting, vacuum heating, and grinding or polishing to form the magnetic metallic substrate, such that the formed magnetic metallic substrate is able to be characterized by not only a superior initial magnetic permeability, but also a high thermal conductivity and low thermal expansion coefficient.

One another aspect of the present invention is to provide an alignment method for transferring a magnetic light-emitting die. The alignment method comprises providing a backplane, which comprises at least one cavity; locating a magnetic pull device, which is below the cavity and disposed correspondingly to the cavity. Next, provide at least one magnetic light-emitting die, which comprises a magnetic metallic substrate and a peripheral electrode formed on the magnetic metallic substrate, wherein the peripheral electrode is surrounding on the magnetic metallic substrate. As such, the magnetic pull device is used to magnetically attract the magnetic light-emitting die such that the magnetic light-emitting die is aligned, transferred and accommodated in the corresponding cavity. According to the embodiment of the present invention, a depth of the cavity is designed to be equal to a thickness of the magnetic metallic substrate. And, the peripheral electrode is formed adjacent to an inner edge of the magnetic metallic substrate to provide electrical conduction with at least one pad on the backplane.

In one embodiment of the present invention, the backplane can be, for example, a transparent substrate or an insulating substrate. A number of the cavity disposed in the backplane is M, a number of the magnetic light-emitting die to be transferred is N, N≥M, and N, M are positive integers.

Furthermore, the magnetic pull device disclosed in the present invention can be buried in a bottom layer of the backplane corresponding to the cavity. Alternatively, the magnetic pull device can be directly disposed external to the backplane as well.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
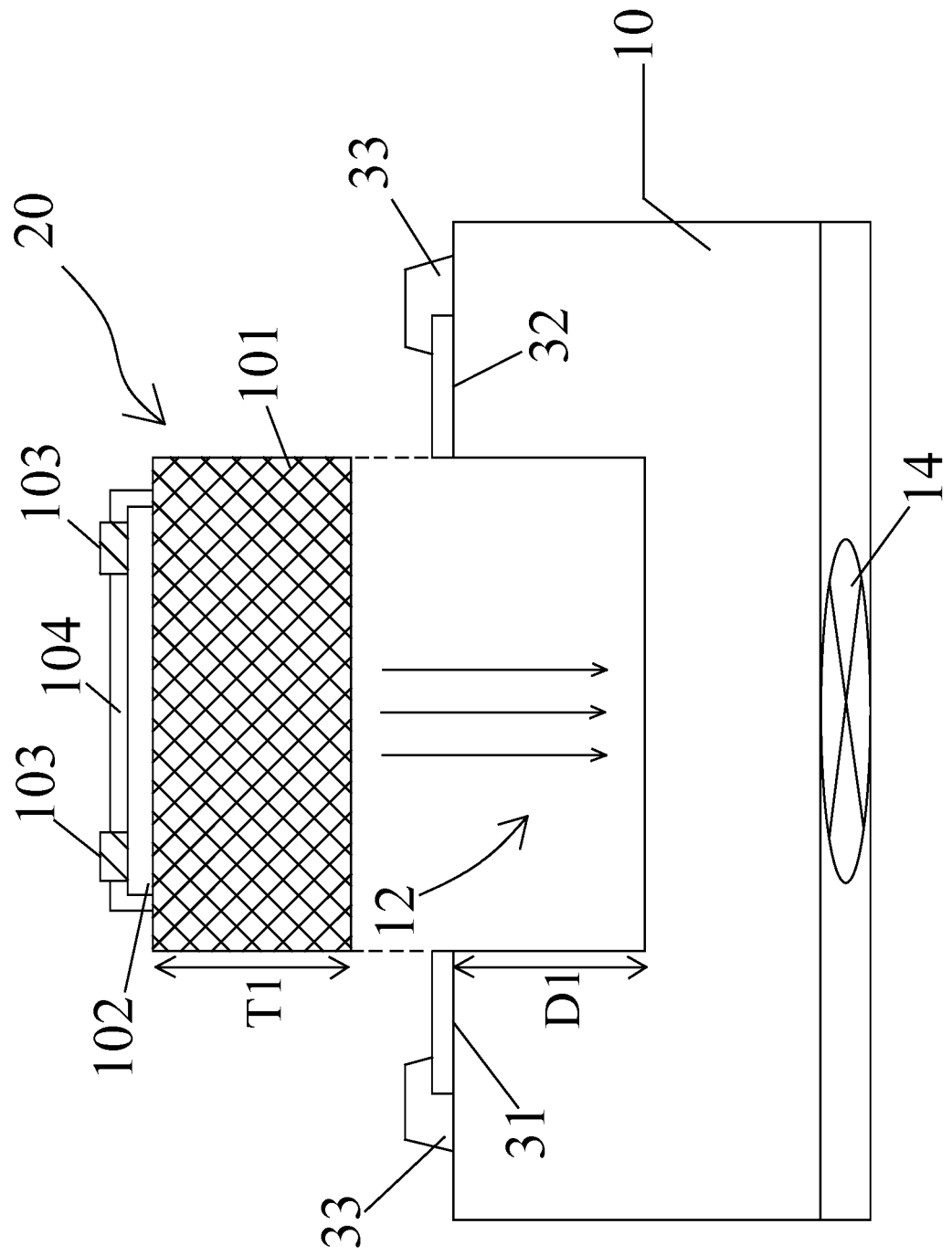
FIG. 1A shows a schematic diagram of an alignment module for transferring a magnetic light-emitting die in accordance with a first embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In view of the various deficiencies disclosed by the above mentioned prior arts, the present invention is aimed to provide an improved die transfer technology. By using the proposed die transfer technology, the present invention is able to achieve accurate die alignment, and thus can be comply with the requirements for rapid die mass transfer in the related industries.

Figure 1B:
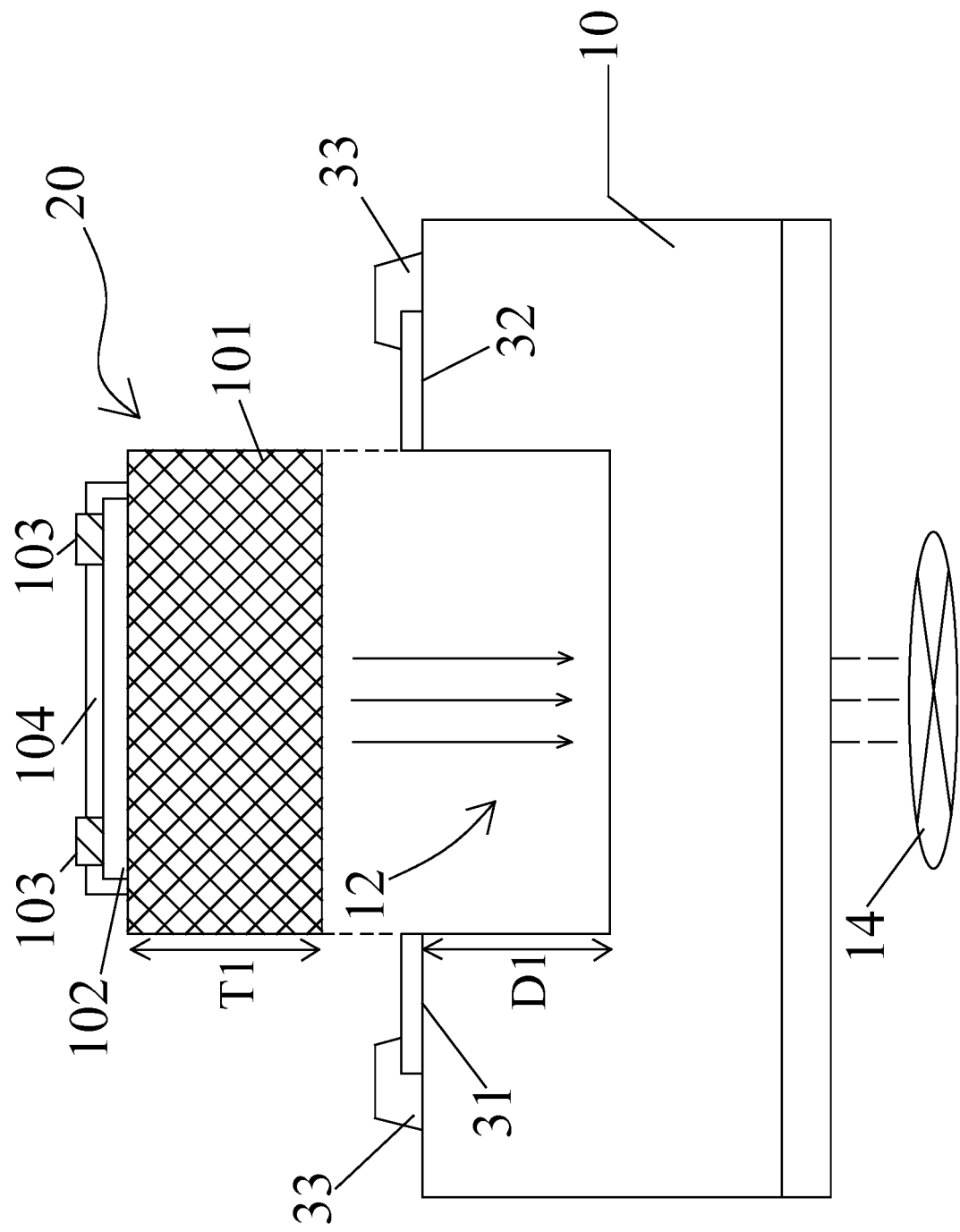
FIG. 1B shows a schematic diagram of an alignment module for transferring a magnetic light-emitting die in accordance with a second embodiment of the present invention.
Figure 2:
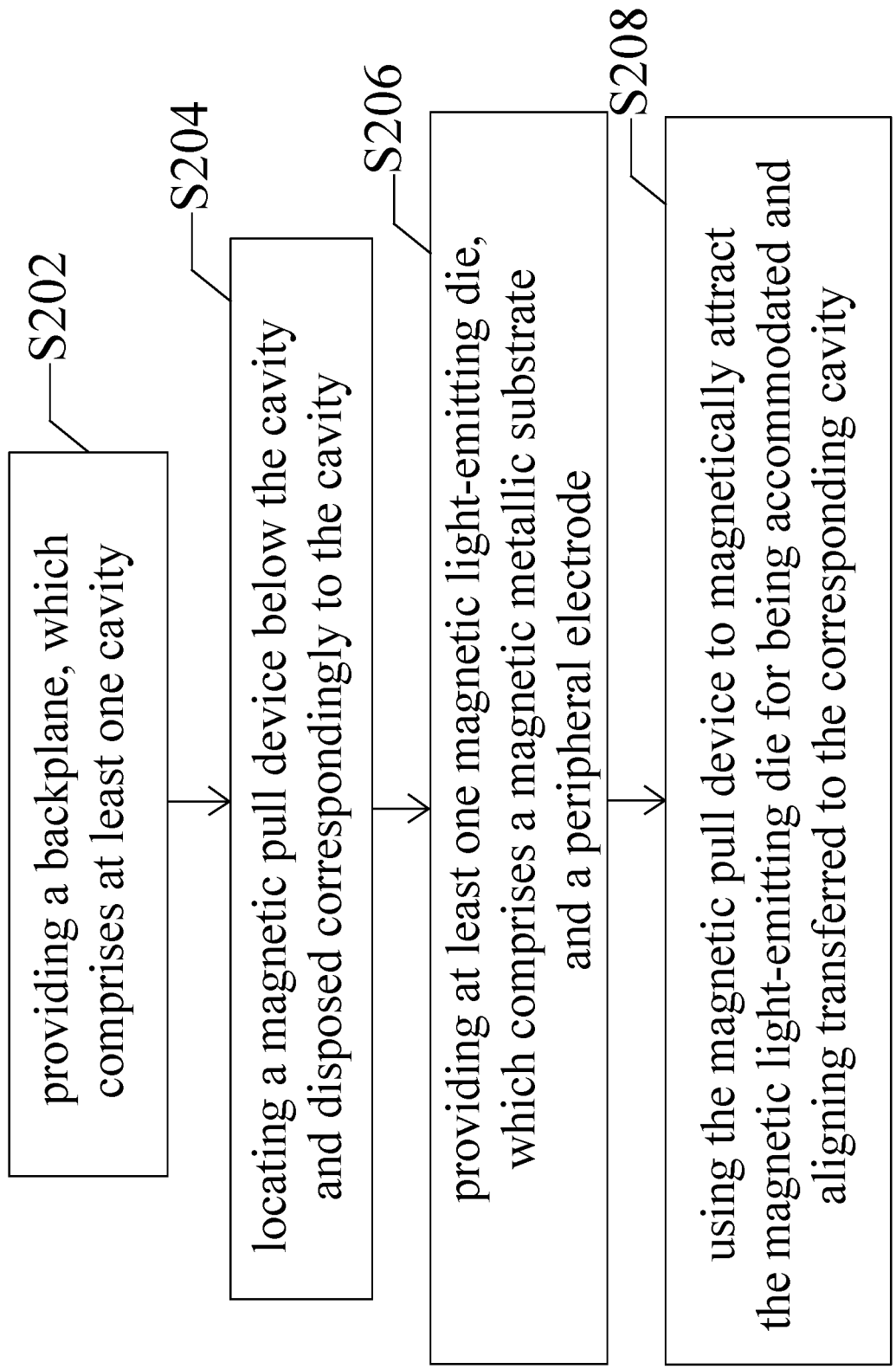
FIG. 2 shows a flow chart of an alignment method for transferring a magnetic light-emitting die in accordance with the embodiment of the present invention.

First, please refer to FIG. 1A and FIG. 1B, which shows a schematic diagram of an alignment module for transferring a magnetic light-emitting die in accordance with a first embodiment and a second embodiment of the present invention, respectively. FIG. 2 shows a flow chart of an alignment method for transferring a magnetic light-emitting die in accordance with the embodiment of the present invention. The alignment method disclosed by the present invention includes step S202, step S204, step S206 and step S208. Regarding the technical contents of the proposed die alignment module and alignment method disclosed by the present invention, please refer to structures in FIG. 1A-1B and steps S202-S208 in FIG. 2 at the same time for detailed descriptions as provided in the following paragraphs.

Figure 3:
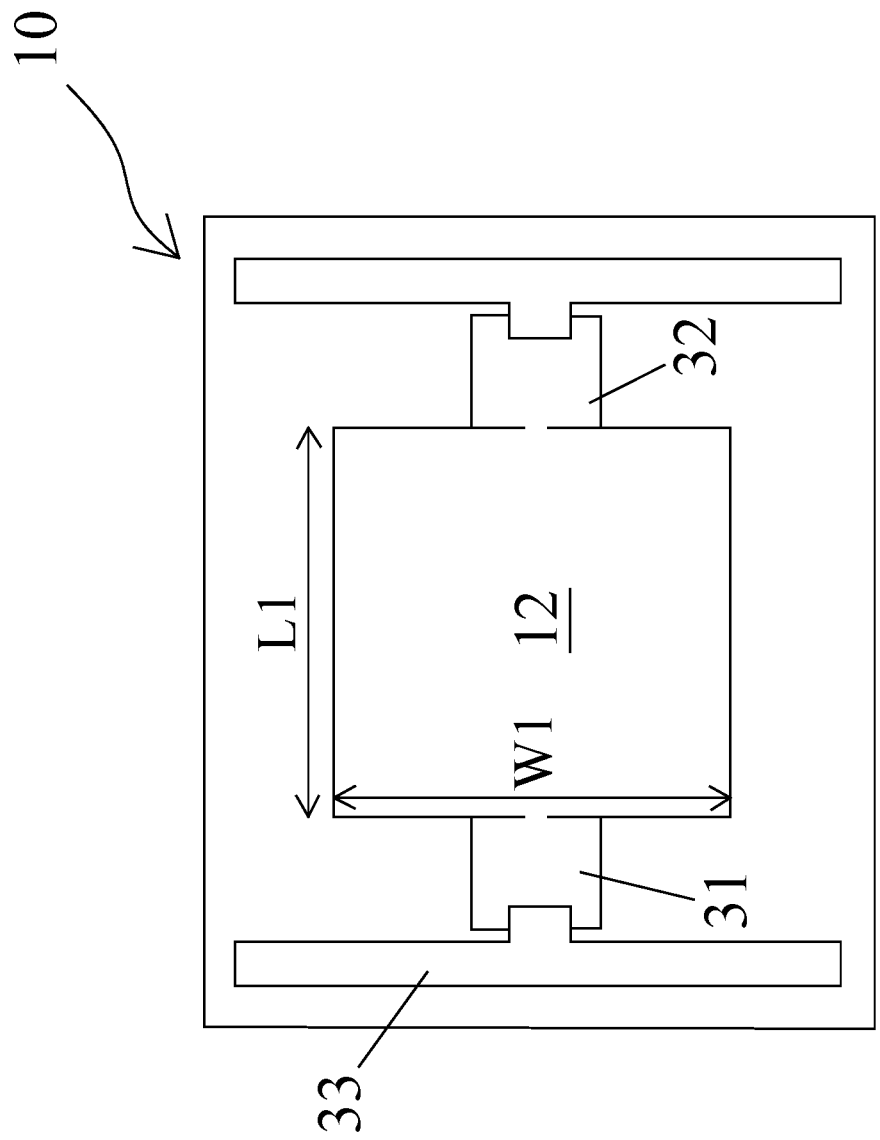
FIG. 3 shows an upper view of the backplane according to the embodiment of the present invention.

As shown in step S202, the present invention provides a backplane 10 first. In one embodiment, the backplane 10 can be, for example, a transparent substrate or an insulating substrate. FIG. 3 shows an upper view of the backplane 10 according to the embodiment of the present invention. As can be seen from FIGS. 1A, 1B and FIG. 3, on the backplane 10 is at least one pad, which comprises a first semiconductor type pad 31 and a second semiconductor type pad 32. At least one cavity 12 is disposed in the backplane 10.

Later, as shown in step S204, the present invention subsequently provides a magnetic pull device 14 located below the cavity 12, and the magnetic pull device 14 is disposed correspondingly to the cavity 12. According to the first embodiment of the present invention, as shown in FIG. 1A, the magnetic pull device 14, for example, can be buried in a bottom layer of the backplane 10 corresponding to the cavity 12. Alternatively, according to the second embodiment of the present invention, as shown in FIG. 1B, the magnetic pull device 14 can also be optionally disposed external to the backplane 10. As such, an absorption force at a distance can be obtained by employing an external device, i.e. the magnetic pull device 14 of the present invention.

According to the present invention, the magnetic pull device 14 may include, for instance, at least one set of electromagnetic coil winding on a magnetic ring (Ferrite Core) and its forming circuits. It can be seen from the top view of FIG. 3 that, the cavity 12 comprises a two-dimensional plane length L1 and a two-dimensional plane width W1, wherein the two-dimensional plane length L1 is equal to the two-dimensional plane width W1, which is between 30 micrometers (μm) and 100 micrometers.

The first semiconductor type pad 31 and the second semiconductor type pad 32 are respectively disposed on opposite sides of the cavity 12 and provide different conductivity types. In one embodiment of the present invention, the first semiconductor type pad 31 for example, can be an N-type pad, and the second semiconductor type pad 32 can be a P-type pad. Each of the first semiconductor type pad 31 and the second semiconductor type pad 32 is further connected with a plurality of transparent conductive wires 33, which are made of ITO (Indium Tin Oxide) or are silver nanowires to provide inputting and outputting signals (I/O).

Next, please refer to step S206 in FIG. 2. The present invention further provides at least one magnetic light-emitting die, as shown in FIGS. 1A and 1B. The magnetic light-emitting die 20 comprises a magnetic metallic substrate 101 and a peripheral electrode 103 which is formed on the magnetic metallic substrate 101, wherein the magnetic metallic substrate 101 disclosed in the present invention uses an extraordinary inventive substrate material, which at least comprises a nickel-iron alloy layer, such that the formed magnetic metallic substrate 101 shows better soft magnetic properties and initial magnetic permeability compared to other traditional substrates. In addition, the magnetic metallic substrate 101 may further comprise a copper layer which is disposed on the nickel-iron alloy layer for providing signal measurements in the following process. Since the nickel-iron alloy layer and the copper layer disclosed by the present invention can be combined through cutting, vacuum heating, and grinding or polishing to form the magnetic metallic substrate 101, the formed magnetic metallic substrate 101 is able to be characterized by not only a superior initial magnetic permeability, but also a high thermal conductivity and low thermal expansion coefficient. Accordingly, in the subsequent wire bonding and packaging process, it helps to provide better production yield. And compared to the other conventional metallic substrates, the production cost of such magnetic metallic substrate 101 can be much lower, and the thickness is thinner as well. As a result, it indeed offers as a new type of substrate, which is easy to be bonded and is also having extremely low thermal expansion coefficient, high thermal conductivity, low production cost, and high yield without the need of any additional thinning process.

Figure 4:
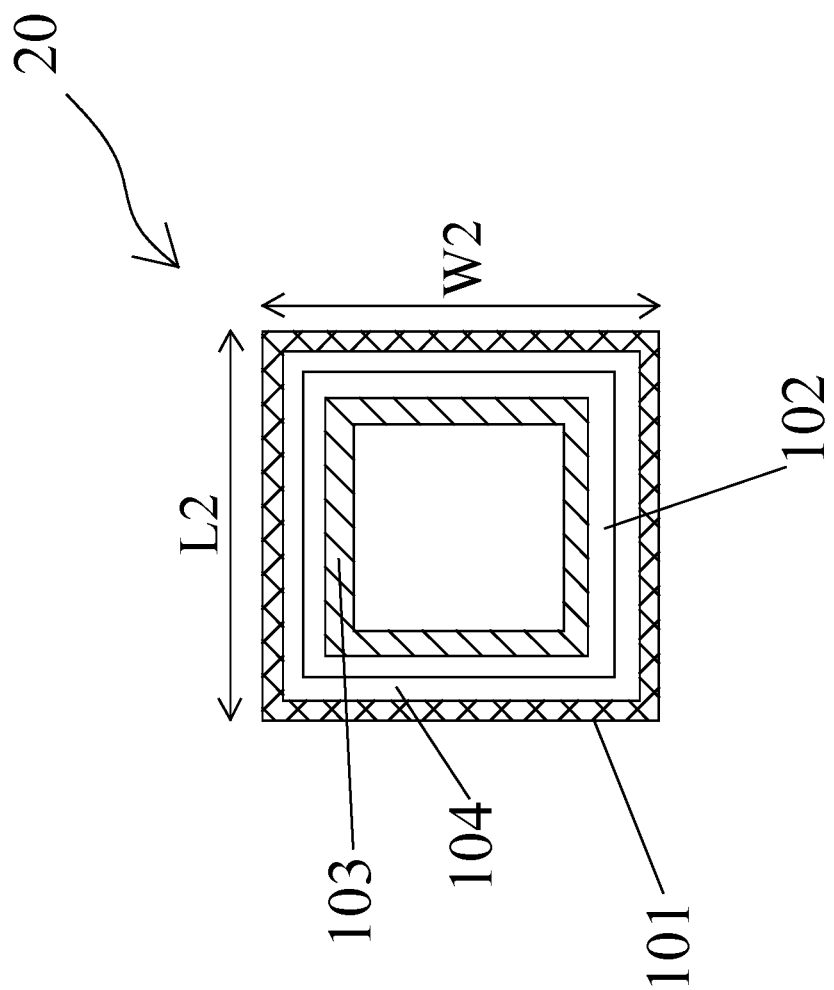
FIG. 4 shows an upper view of the magnetic light-emitting die according to the embodiment of the present invention.

FIG. 4 shows an upper view of the magnetic light-emitting die 20 according to the embodiment of the present invention. As can be seen, the magnetic metallic substrate 101 also comprises a two-dimensional plane length L2 and a two-dimensional plane width W2, wherein the two-dimensional plane length L2 is equal to the two-dimensional plane width W2. Please refer to FIGS. 1A, 1B and FIG. 4 at the same time. It is obvious that the peripheral electrode 103 of the magnetic light-emitting die 20 is surrounding on the magnetic metallic substrate 101 and formed adjacent to an inner edge of the magnetic metallic substrate 101. The peripheral electrode 103 is configured as surrounding and disposing on the magnetic metallic substrate 101 in a closed and symmetrical pattern. The electrode pattern can be, for example, a symmetrical square or circle. In FIG. 4, a square is taken as an illustrative example, and yet, nevertheless the present invention should not be limited thereto. An epitaxial layer 102 and a transparent insulating layer 104 are formed between the magnetic metallic substrate 101 and the peripheral electrode 103. The epitaxial layer 102 is formed on an upper surface of the magnetic metallic substrate 101. The transparent insulating layer 104 covers on the epitaxial layer 102. The peripheral electrode 103 is disposed on the transparent insulating layer 104 and penetrates through the transparent insulating layer 104 to electrically couple with the epitaxial layer 102 under the transparent insulating layer 104.

Please refer to FIG. 1A and FIG. 1B. It draws our attention that, the present invention is designed to control a depth D1 of the cavity 12 in the backplane 10 is equal to a thickness T1 of the magnetic metallic substrate 101, such that D1=T1. In addition, both the depth D1 of the cavity 12 and the thickness T1 of the magnetic metallic substrate 101 are between 30 μm and 50 μm, so as to comply with the current trend of miniaturization of light-emitting components in the related industries.

Figure 5A:
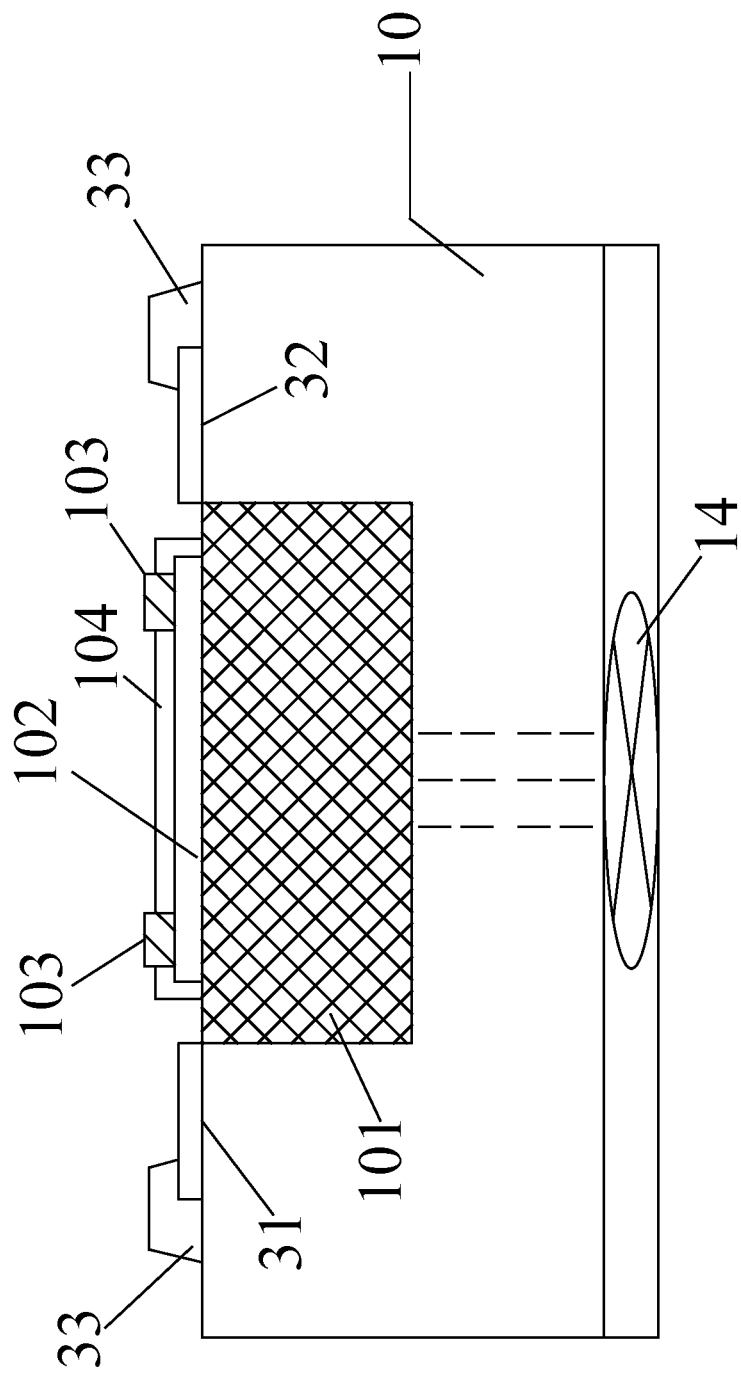
FIG. 5A shows a cross sectional view of the alignment module after the die is transferred in accordance with the embodiment in FIG. 1A.
Figure 5B:
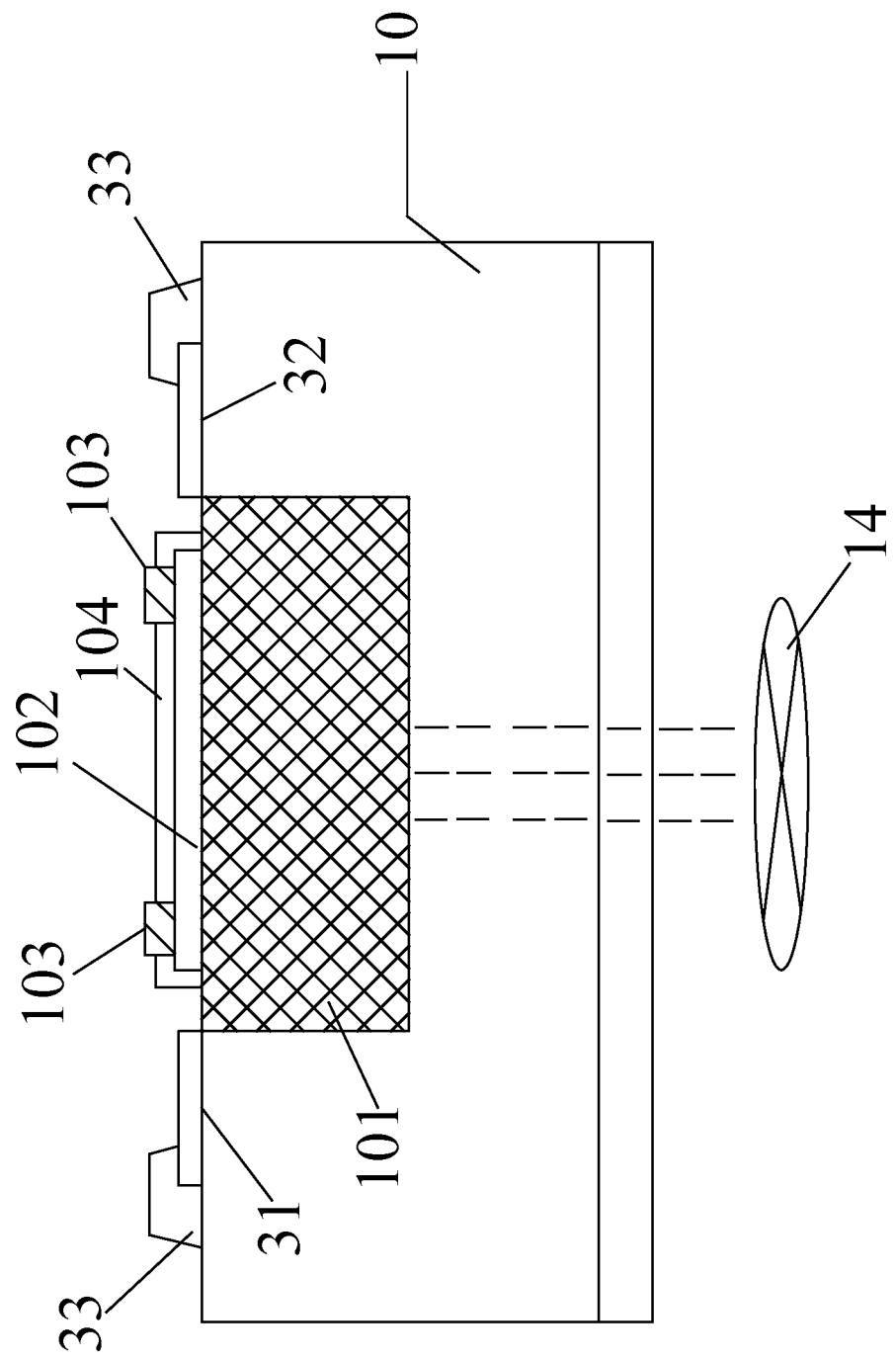
FIG. 5B shows a cross sectional view of the alignment module after the die is transferred in accordance with the embodiment in FIG. 1B.
Figure 5C:
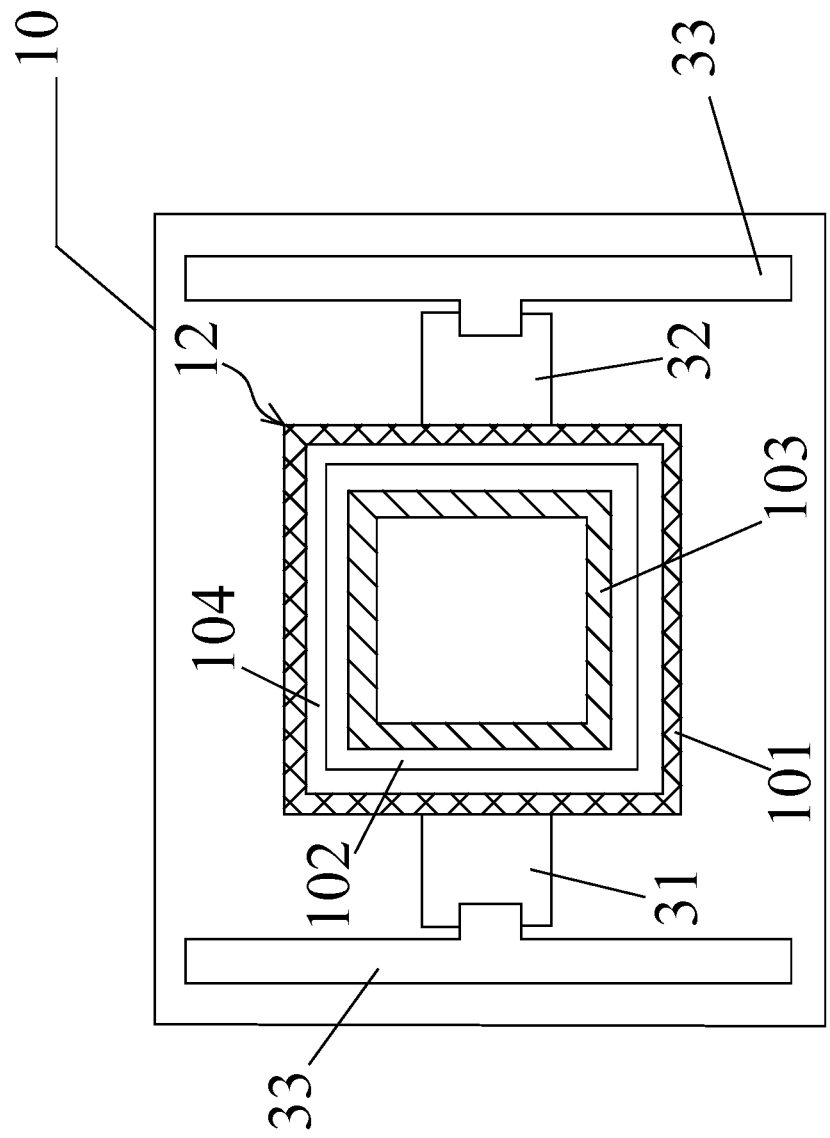
FIG. 5C shows an upper view of the alignment module after the die is transferred in accordance with the embodiment of the present invention.

As a result, with referring to step S208 in FIG. 2, the present invention uses the magnetic pull device 14 located below the cavity 12 to magnetically attract the magnetic light-emitting die 20 so the magnetic light-emitting die 20 can be aligned, transferred and accommodated in the corresponding cavity 12. The schematic diagrams after the transfer is complete are shown as in FIG. 5A to FIG. 5C, wherein FIG. 5A and FIG. 5B show cross sectional views of the alignment module after the die is transferred in accordance with the embodiment in FIG. 1A and the embodiment in FIG. 1B, respectively. FIG. 5C shows its upper view. From these schematic diagrams, it is obvious that, according to the technical solutions disclosed in the present invention, it is sophisticatedly designed that D1=T1, and L1=W1=L2=W2, such that the magnetic metallic substrate 101 of the magnetic light-emitting die 20 is consistent with the corresponding cavity 12 after being transferred into the backplane 10.

Figure 6A:
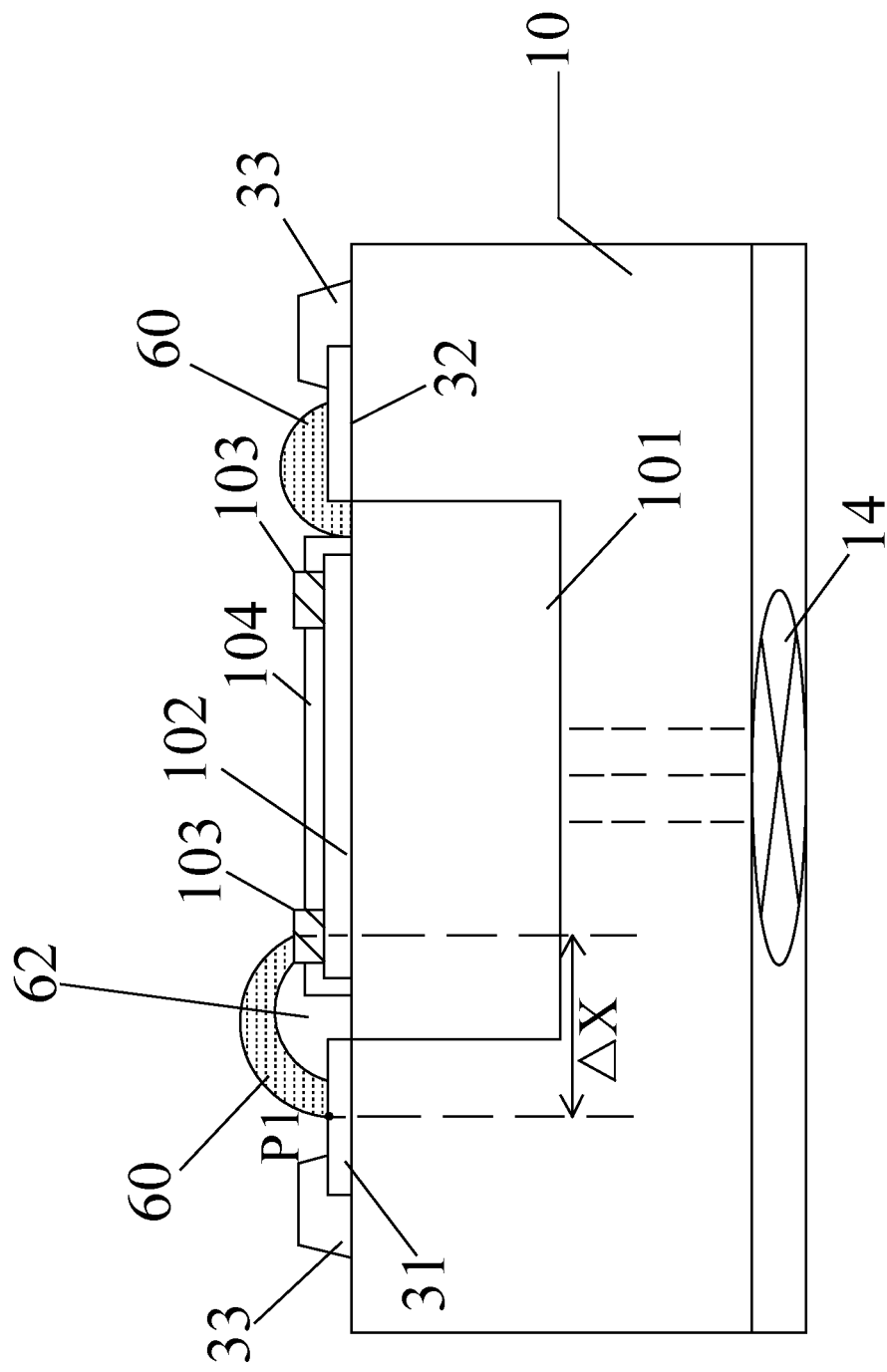
FIG. 6A shows a schematic diagram of the alignment module after the die is transferred and subsequent post bonding processes are performed in accordance with the embodiment in FIG. 1A.
Figure 6B:
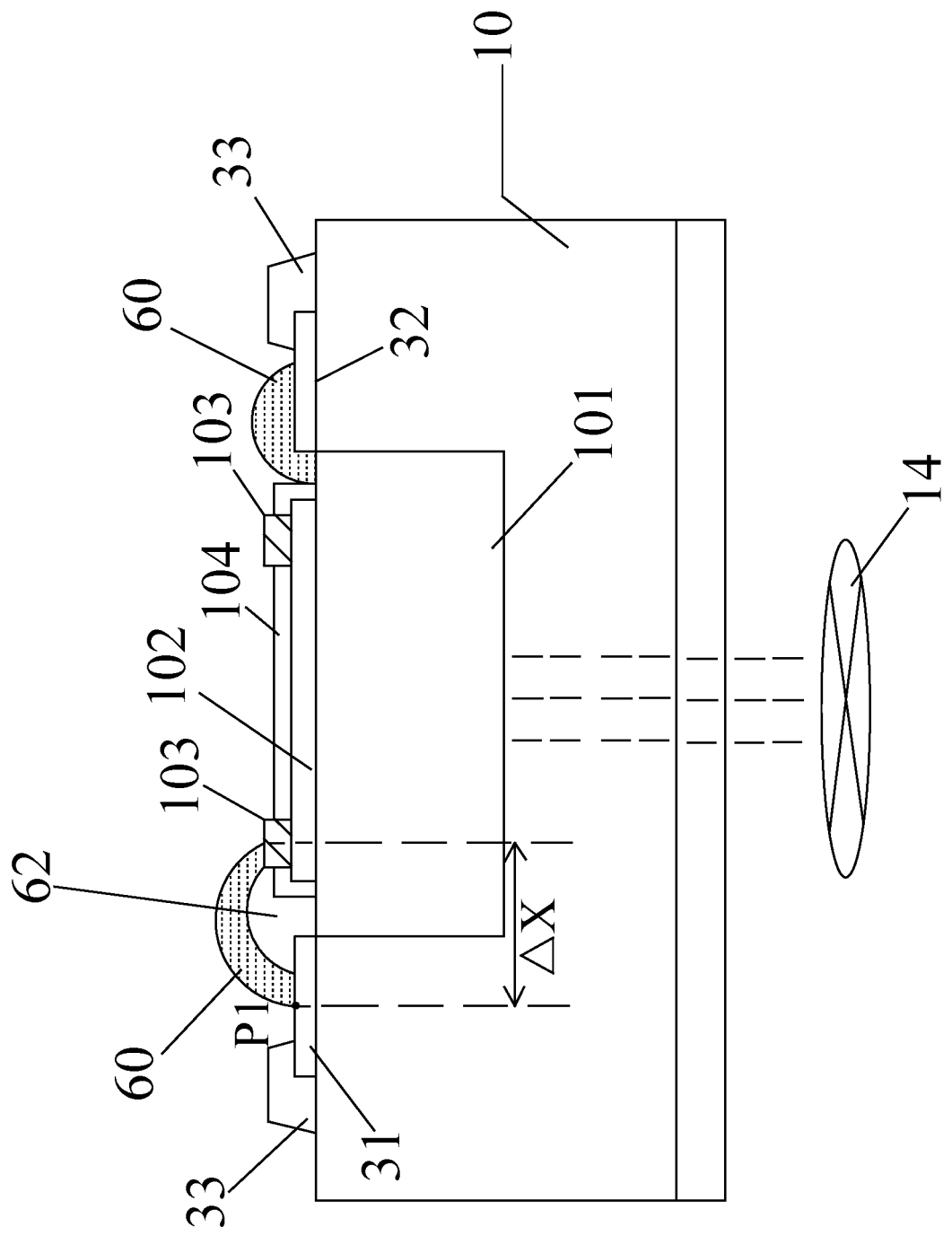
FIG. 6B shows a schematic diagram of the alignment module after the die is transferred and subsequent post bonding processes are performed in accordance with the embodiment in FIG. 1B.

After that, as shown in FIG. 6A and FIG. 6B, the alignment module after the die is successfully transferred by employing the alignment method proposed in the first and second embodiments of the present invention can be further processed with subsequent post bonding processes, so that the peripheral electrode 103 is electrically connected with the first semiconductor type pad 31 and the second semiconductor type pad 32 on the backplane 10 and provides electrical conduction.

Specifically, the first semiconductor type pad 31 and the second semiconductor type pad 32 are electrically connected with the peripheral electrode 103 and the magnetic metallic substrate 101 of the magnetic light-emitting die 20 through a soldering material 60, respectively. Meanwhile, an electrical insulating layer 62 is further disposed between the first semiconductor type pad 31, the soldering material 60, the peripheral electrode 103 and its transparent insulating layer 104 down below for preventing short-circuit. According to the embodiment of the present invention, the above-mentioned soldering material 60 may comprise, for example, a solder paste or a solder ball. However, the present invention is definitely not limited thereto. The species of the soldering material 60 is allowed as being adjustable according to the actual back-end process as required.

As a result, when the magnetic light-emitting die 20 is employed with wire bonding and packaging to form a vertical type light emitting diode (LED) die, such vertical type LED die is able to show great initial magnetic permeability owing to the magnetic metallic substrate 101. Moreover, due to the initial magnetic permeability of this novel and thinner magnetic metallic substrate 101, the magnetic metallic substrate 101 achieves to generate a micro current and transmit the micro current to the epitaxial layer 102 to form a Micro LED. After that, the formed Micro LED can be further integrated into a high-density and small-size LED array on the wafer, so that each pixel therein can be effectively addressed and individually driven to illuminate. In addition, as shown in FIG. 6B, after the vertical type LED die is assembled into a LED module, the absorption force at a distance provided by the external device, i.e. the magnetic pull device 14 (for example, electromagnetic coils) of the present invention can be further employed to magnetically attract a large amount of the LED dies in one time to achieve a new application of massive transfer, so as to fully meet the application requirements of LED modules for performing massive transfer.

It is noted that as shown in FIG. 6A-6B, according to a preferred embodiment of the present invention, an interspace ΔX is formed between an outer contact P1, where the soldering material 60 is connected with the first semiconductor type pad 31 and the peripheral electrode 103. Since a conventional upper electrode is usually placed in a center of the entire die structure, the soldering distance between the upper electrode and the pads will be too long when subsequent welding is performed. In order to prevent such issue, configuration of the peripheral electrode 103 of the present invention is well designed such that the peripheral electrode 103 is surrounding on the magnetic metallic substrate 101 and disposing on the magnetic metallic substrate 101 in a closed and symmetrical pattern, which is adjacent to an inner edge of the magnetic metallic substrate 101. By such configuration, the interspace ΔX is effectively controlled and can be greatly reduced. Preferably, the interspace ΔX can be less than 10 μm. Therefore, the use of the soldering material can be decreased and length of the soldering distance can be shortened as well due to a minimized ΔX. Similarly, the technical solution for minimizing ΔX can also be applied to the second semiconductor type pad 32 side. People who are skilled in the art are allowed to make variations based on their actual implementation specifications without departing from the spirits of the invention, and yet still fall within the scope of the present invention.

More specifically, in a further aspect for meeting the massive transfer requirements of the industries, the alignment module and alignment method for transferring the magnetic light-emitting die disclosed in the present invention can also be further applied to transferring a plurality of dies which are expected to be transferred. Under such condition, a number of cavities 12 disposed in the backplane 10 is M, a number of magnetic light-emitting dies 20 to be transferred is N, N≥M, and N, M are positive integers. As a result, the present invention achieves to successfully align and transfer the N dies to the corresponding cavity in the backplane through magnetically attracting and vibrating of the magnetic pull device, no matter a vibrating mechanism is additionally disposed or a vibrating magnetic platform is directly used.

Figure 7:
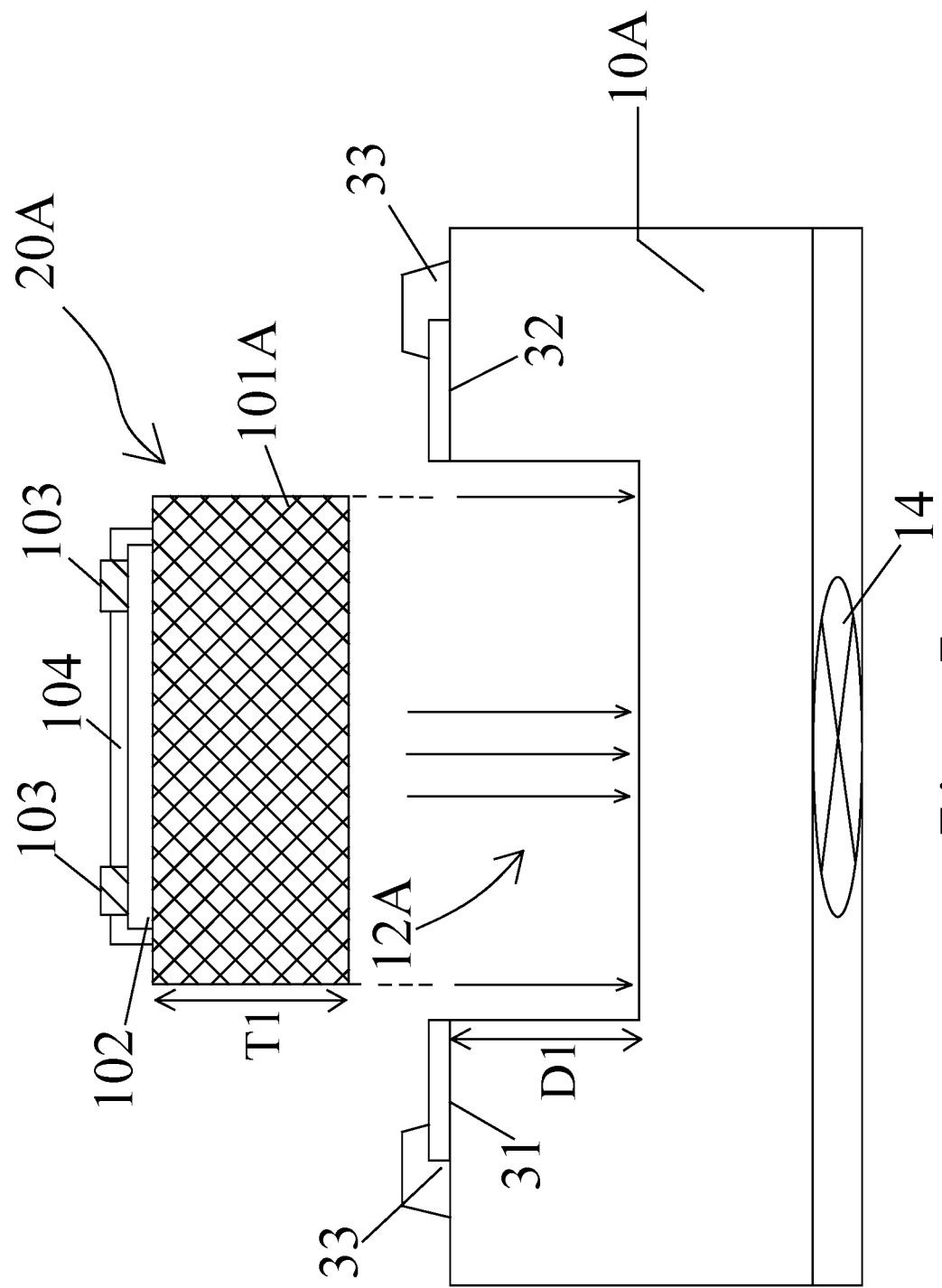
FIG. 7 shows a schematic diagram of an alignment module for transferring a magnetic light-emitting die in accordance with another embodiment of the present invention.

On the other hand, various embodiment regarding the sizes of the magnetic metallic substrate 101 and its corresponding cavity 12 will be illustrated as shown in FIG. 7. In such embodiment, a magnetic light-emitting die 20A is expected to be aligned and transferred to the cavity 12A of the backplane 10A. It can be seen that, the size of the magnetic metallic substrate 101A of the magnetic light-emitting die 20A is less than the size of its corresponding cavity 12A. However, the depth D1 of the cavity 12A remains equal to the thickness T1 of the magnetic metallic substrate 101A, such that D1=T1, and both are between 30 μm and 50 μm.

In general, the location of the magnetic pull device 14 can be designed as described earlier in FIG. 1A and FIG. 1B. For people who are skilled in the art and have ordinary knowledge backgrounds, the magnetic pull device 14, for example, can be buried in a bottom layer of the backplane 10A, or alternatively, disposed external to the backplane 10A depending on various requirements. In the following paragraphs, regarding the embodiment of a smaller-sized magnetic metallic substrate 101A in FIG. 7, the magnetic pull device 14, which is buried in a bottom layer of the backplane 10A is taken as an explanatory example for describing the technical contents. Nevertheless, such technical contents may also be applied to another embodiment of the magnetic pull device 14, which is disposed external to the backplane 10A. The present invention spares the similar descriptions thereto.

Figure 8:
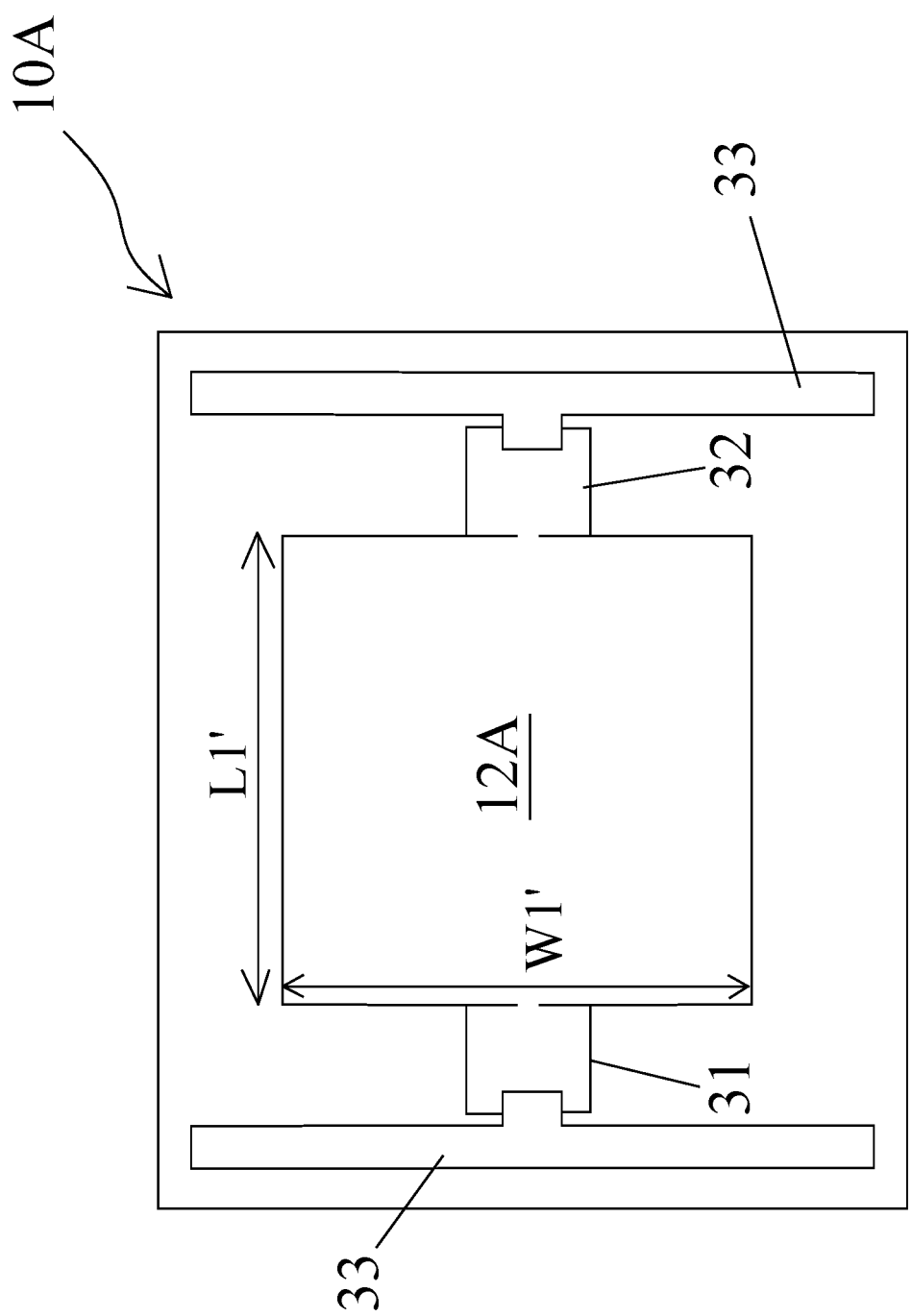
FIG. 8 shows an upper view of the backplane in accordance with the embodiment in FIG. 7.
Figure 9:
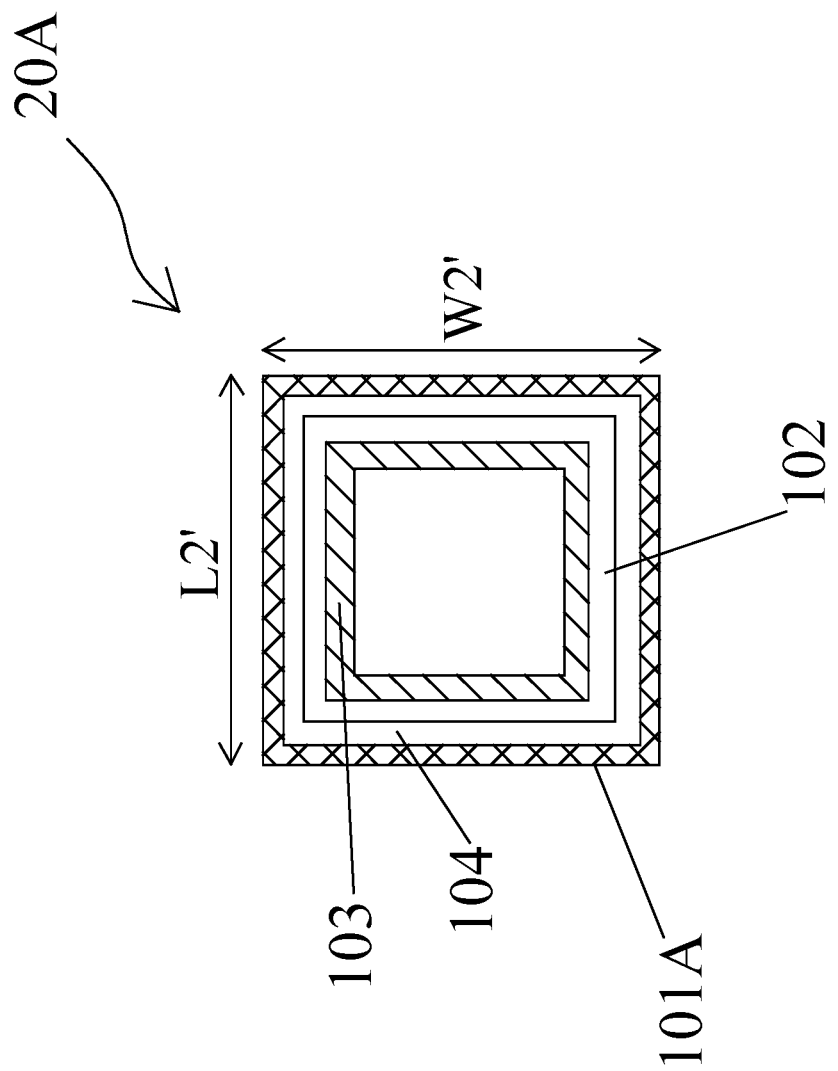
FIG. 9 shows an upper view of the magnetic light-emitting die in accordance with the embodiment in FIG. 7.
Figure 10A:
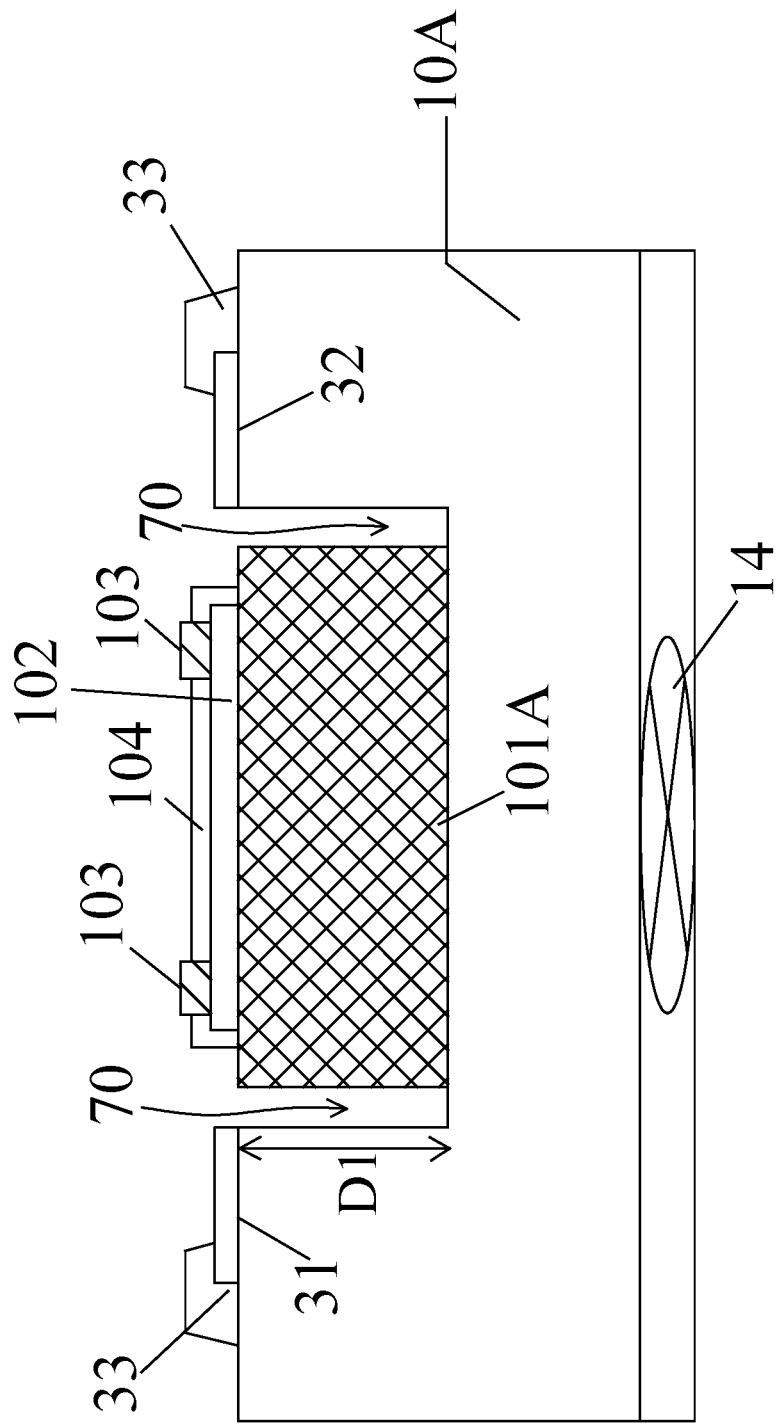
FIG. 10A shows a cross sectional view of the alignment module after the die is transferred in accordance with the embodiment in FIG. 7.
Figure 10B:
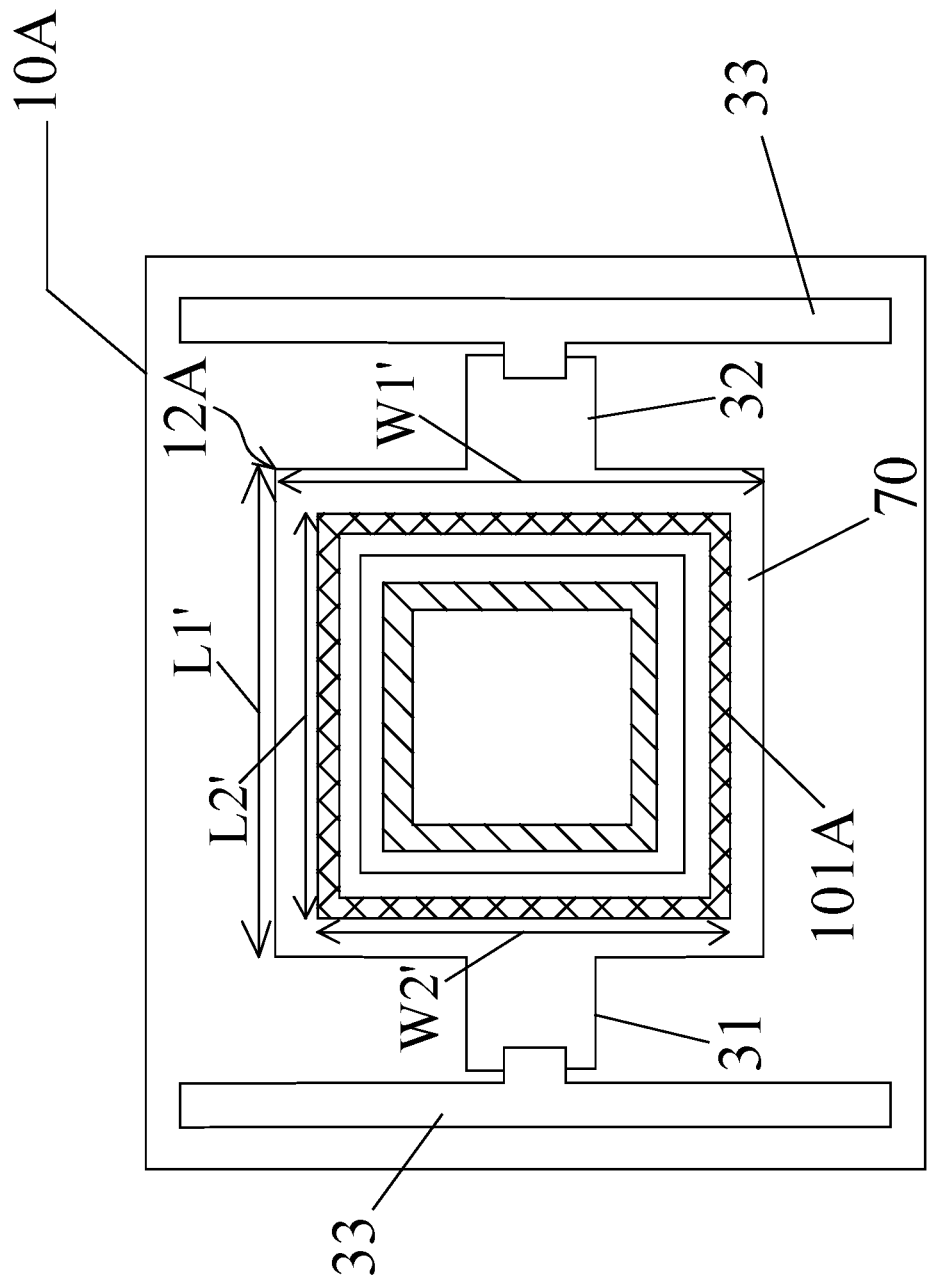
FIG. 10B shows an upper view of the alignment module after the die is transferred in accordance with the embodiment in FIG. 7.

Please refer to FIG. 8 and FIG. 9, which individually show an upper view of the backplane 10A and the magnetic light-emitting die 20A. From these figures, it is apparent that in such an embodiment, the cavity 12A comprises a two-dimensional plane length L1' and a two-dimensional plane width W1', wherein the two-dimensional plane length L1' is equal to the two-dimensional plane width W1', which is between 30 micrometers (μm) and 100 micrometers. Similarly, the magnetic metallic substrate 101A also comprises a two-dimensional plane length L2' and a two-dimensional plane width W2', wherein the two-dimensional plane length L2' is equal to the two-dimensional plane width W2'. What differs from the embodiments in FIG. 1A-1B to FIG. 6A-6B is that, the two-dimensional plane length L1' and the two-dimensional plane width W1' of the cavity 12A are greater than the two-dimensional plane length L2' and the two-dimensional plane width W2' of the magnetic metallic substrate 101A, such that L1'>L2', W1'>W2'. Under such condition, when the magnetic light-emitting die 20A is transferred to the backplane 10A, a gap 70 will be formed between the magnetic metallic substrate 101A and the cavity 12A, as shown in FIG. 10A and FIG. 10B.

Figure 11:
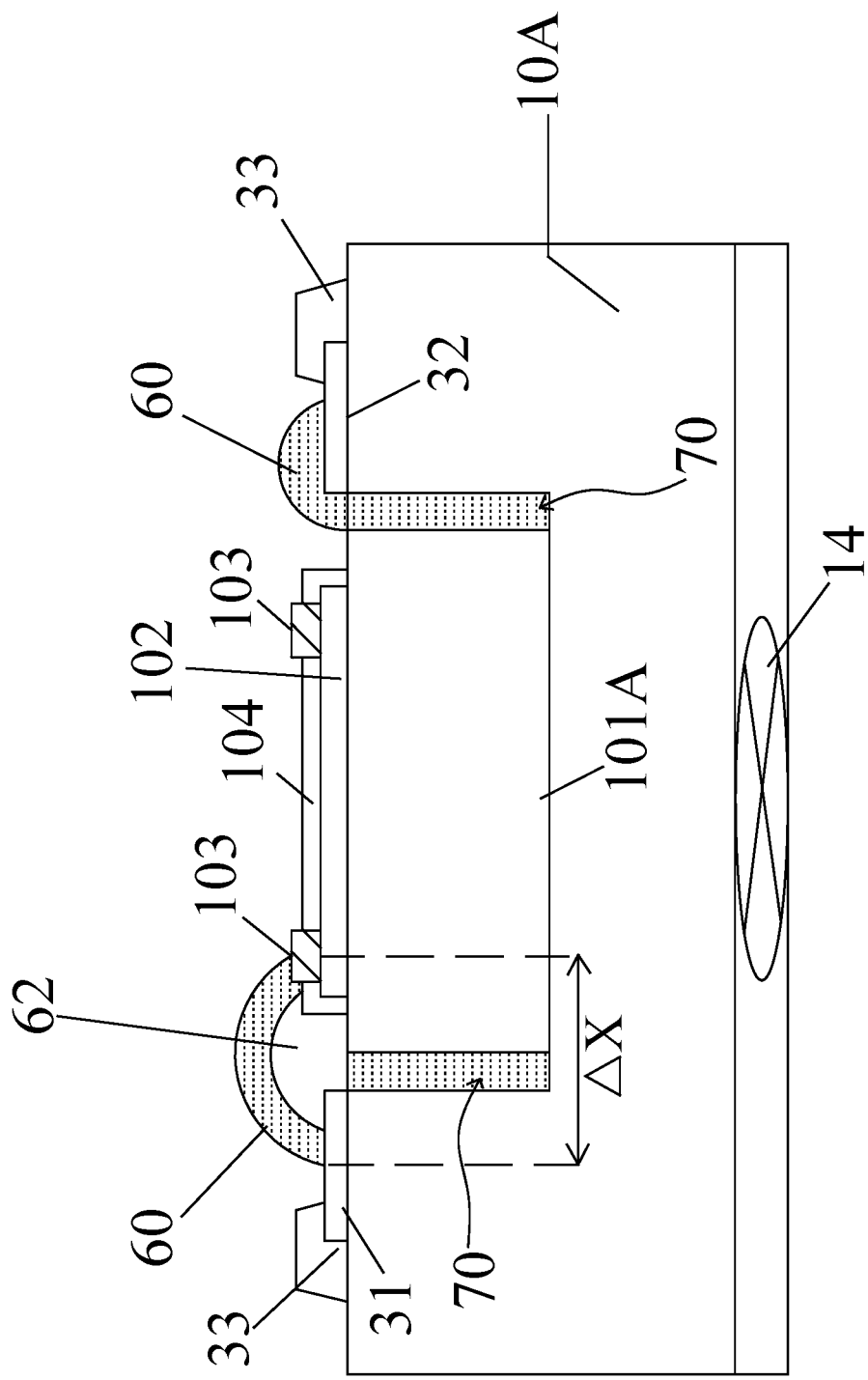
FIG. 11 shows a schematic diagram of the alignment module after the die is transferred and subsequent post bonding processes are performed in accordance with the embodiment in FIG. 7.

Afterwards, subsequent post bonding processes utilizing the soldering material 60 can be applied to the alignment module after the die is successfully transferred by employing the proposed present invention, which is illustrated as shown in FIG. 11. Among them, the connecting configurations between the peripheral electrode, the magnetic metallic substrate and the pads on the backplane are basically the same as those in the previous embodiment (FIG. 6A-6B). Therefore, the similar technical characteristics are not repeated herein. What is noted is that, in such an embodiment of FIG. 11, the gap 70 between the magnetic metallic substrate 101A and the cavity 12A can be filled with the foregoing soldering material 60. Alternatively, the gap 70 may also be filled with an insulating material. In addition, regarding the embodiment in FIG. 11, the interspace ΔX can also be minimized by improving the position of the peripheral electrode 103, so that the interspace ΔX is preferably less than 10 μm, which effectively reduces the use of the soldering material and shortens the soldering distance.

Therefore, to sum up, according to the several embodiments and the technical contents disclosed by the present invention, it is believed that, those with ordinary knowledge in the field are able to make modifications based on their actual implementation specifications, and yet still fall into the scope of the present invention. It is worth noting that, the several illustrative embodiments described in the present invention are intended to merely explain the main technical features of the present invention so that those skilled in the art are able to understand and make implementations accordingly, but not to limit the present invention.

Moreover, it is apparent that, the present invention proposes a novel alignment module and alignment method for transferring a magnetic light-emitting die, which modifies the original die substrate structure and materials to have better soft magnetic properties and initial magnetic permeability. As a result, the LED die itself can be taken as a magnetic conductive structure. As long as it is assembled with a magnetic pull device and its corresponding cavity in the backplane, a great number of LED die structures having such soft magnetic properties can be absorbed by employing the magnetically attracting force to achieve rapid and accurate transfer. Furthermore, a mass transfer result can be accomplished when a plurality of corresponding cavities are disposed. As a result, the present invention is successfully aimed to meet the requirements of the current Micro LED technology for rapid mass transfer, and effectively enhances its industrial production competitiveness.

In addition, another major objective of the present invention is to modify the position of its upper electrode (which is the proposed peripheral electrode) so that the conventional soldering distance can be minimized. Such improved soldering distance is preferably less than 10 μm, whereby reduces the use of the conventional soldering material and shortens the soldering distance. As a result, the Applicants assert that the present invention is instinct, effective and highly competitive for incoming technologies, industries and researches developed in the future. Also, it is obvious that the technical features, means and effects achieved by the present invention are significantly different from the current solutions, and can not be accomplished easily by those who are familiar with the industry. As a result, it is believed that the present invention is indeed characterized by patentability and shall be patentable soon in a near future.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An alignment module for transferring a magnetic light-emitting die, comprising:
    a backplane, comprising at least one cavity;
    a magnetic pull device, being located below the cavity and disposed correspondingly to the cavity; and
    at least one magnetic light-emitting die, comprising a magnetic metallic substrate and a peripheral electrode formed on the magnetic metallic substrate, wherein the peripheral electrode is surrounding on the magnetic metallic substrate and formed adjacent to an inner edge of the magnetic metallic substrate to provide electrical conduction with at least one pad on the backplane, and wherein a depth of the cavity is equal to a thickness of the magnetic metallic substrate such that the at least one magnetic light-emitting die is aligned, transferred and accommodated in the backplane by using the cavity and the magnetic pull device.

2. The alignment module of claim 1, wherein the magnetic pull device is buried in a bottom layer of the backplane corresponding to the cavity.

3. The alignment module of claim 1, wherein the magnetic pull device is disposed external to the backplane.

4. The alignment module of claim 1, wherein the depth of the cavity and the thickness of the magnetic metallic substrate are between 30 µm and 50 µm.

5. The alignment module of claim 1, wherein the magnetic light-emitting die further comprises an epitaxial layer and a transparent insulating layer, the epitaxial layer is formed on an upper surface of the magnetic metallic substrate, the transparent insulating layer covers on the epitaxial layer, the peripheral electrode is disposed on the transparent insulating layer and penetrates through the transparent insulating layer to electrically couple with the epitaxial layer under the transparent insulating layer, and wherein the magnetic light-emitting die is a vertical type light emitting diode (LED) die of initial magnetic permeability, such that the magnetic metallic substrate generates a micro current and transmit the micro current to the epitaxial layer because of the initial magnetic permeability.

6. The alignment module of claim 1, wherein the at least one pad on the backplane comprises a first semiconductor type pad and a second semiconductor type pad, which are respectively disposed on opposite sides of the cavity and provide different conductivity types.

7. The alignment module of claim 6, wherein the first semiconductor type pad and the second semiconductor type pad are electrically connected with the peripheral electrode and the magnetic metallic substrate through a soldering material, respectively, and an interspace is formed between an outer contact, where the soldering material is connected with the first semiconductor type pad or the second semiconductor type pad, and the peripheral electrode, the interspace is less than 10 µm, and wherein an electrical insulating layer is further disposed between the at least one pad, the soldering material, the peripheral electrode and the transparent insulating layer for preventing short-circuit.

8. The alignment module of claim 1, wherein each of the cavity and the magnetic metallic substrate comprises a two-dimensional plane length and a two-dimensional plane width, the two-dimensional plane length of the cavity is equal to the two-dimensional plane width of the cavity, the two-dimensional plane length of the magnetic metallic substrate is equal to the two-dimensional plane width of the magnetic metallic substrate, the two-dimensional plane length and the two-dimensional plane width of the cavity are greater than the two-dimensional plane length and the two-dimensional plane width of the magnetic metallic substrate, such that a gap is formed between the magnetic metallic substrate and the cavity after the magnetic light-emitting die is transferred, and wherein the gap is filled with a soldering material or an insulating material.

9. The alignment module of claim 1, wherein the backplane is a transparent substrate or an insulating substrate.

10. The alignment module of claim 1, wherein a number of the cavity disposed in the backplane is M, a number of the magnetic light-emitting die to be transferred is N, N≥M, and N, M are positive integers.

11. The alignment module of claim 1, wherein the magnetic metallic substrate at least comprises a nickel-iron alloy layer.

12. The alignment module of claim 1, wherein the magnetic metallic substrate comprises a nickel-iron alloy layer and a copper layer which is disposed on the nickel-iron alloy layer.

13. An alignment method for transferring a magnetic light-emitting die, comprising:
    providing a backplane, which comprises at least one cavity;
    locating a magnetic pull device, which is below the cavity and disposed correspondingly to the cavity;
    providing at least one magnetic light-emitting die, which comprises a magnetic metallic substrate and a peripheral electrode formed on the magnetic metallic substrate, wherein the peripheral electrode is surrounding on the magnetic metallic substrate; and
    using the magnetic pull device to magnetically attract the at least one magnetic light-emitting die such that the at least one magnetic light-emitting die is aligned, transferred and accommodated in the at least one cavity, wherein a depth of the cavity is equal to a thickness of the magnetic metallic substrate and the peripheral electrode is formed adjacent to an inner edge of the magnetic metallic substrate to provide electrical conduction with at least one pad on the backplane.

14. The alignment method of claim 13, wherein the magnetic pull device is buried in a bottom layer of the backplane corresponding to the cavity.

15. The alignment method of claim 13, wherein the magnetic pull device is disposed external to the backplane.

16. The alignment method of claim 13, wherein the depth of the cavity and the thickness of the magnetic metallic substrate are between 30 µm and 50 µm.

17. The alignment method of claim 13, wherein each of the cavity and the magnetic metallic substrate comprises a two-dimensional plane length and a two-dimensional plane width, the two-dimensional plane length of the cavity is equal to the two-dimensional plane width of the cavity, the two-dimensional plane length of the magnetic metallic substrate is equal to the two-dimensional plane width of the magnetic metallic substrate, the two-dimensional plane length and the two-dimensional plane width of the cavity are greater than the two-dimensional plane length and the two-dimensional plane width of the magnetic metallic substrate, such that a gap is formed between the magnetic metallic substrate and the cavity after the magnetic light-emitting die is transferred, and wherein the gap is filled with a soldering material or an insulating material.

18. The alignment method of claim 13, wherein a number of the cavity disposed in the backplane is M, a number of the magnetic light-emitting die to be transferred is N, N≥M, and N, M are positive integers.

19. The alignment method of claim 13, wherein the magnetic metallic substrate at least comprises a nickel-iron alloy layer.

20. The alignment method of claim 13, wherein the magnetic metallic substrate comprises a nickel-iron alloy layer and a copper layer which is disposed on the nickel-iron alloy layer.

* * * * *